United States Patent [19]

Bhatnagar et al.

[11] Patent Number: 5,710,455
[45] Date of Patent: Jan. 20, 1998

[54] LATERAL MOSFET WITH MODIFIED FIELD PLATES AND DAMAGE AREAS

[75] Inventors: Mohit Bhatnagar; Charles E. Weitzel, both of Mesa; Michael Zunino, Tempe, all of Ariz.

[73] Assignee: Motorola, Schaumburg, Ill.

[21] Appl. No.: 681,683

[22] Filed: Jul. 29, 1996

[51] Int. Cl.⁶ .......................... H01L 23/58; H01L 31/108
[52] U.S. Cl. .................. 257/472; 257/487; 257/491; 257/493
[58] Field of Search .......................... 257/491, 492, 257/493, 213, 291, 292, 293, 294, 401, 402, 404, 487, 488

[56] References Cited

U.S. PATENT DOCUMENTS 5,569,937  10/1996  Bhatnager et al. .................. 257/492

Primary Examiner—Carl W. Whitehead, Jr.
Attorney, Agent, or Firm—Eugene A. Parsons

[57] ABSTRACT

A FET including a channel region and a drift region in a channel layer with a source in the channel region and a drain in the drift region. The current channel between the source and drain defining a straight transistor portion and a curved transistor portion. An oxide with a thin portion overlying the channel region and a thick portion overlying the drift region, and a gate on the thin oxide overlying the current channel. A drain field plate and a gate field plate on the thick oxide with spaced apart edges and a damaged region underlying the edges of the field plates only in the curved transistor portion to reduce electric fields at the edges of the field plates. Also, the current channel has a greater length and the edges are spaced apart farther in the curved transistor portions.

13 Claims, 2 Drawing Sheets

LATERAL MOSFET WITH MODIFIED FIELD PLATES AND DAMAGE AREAS

FIELD OF THE INVENTION

The present invention pertains to field effect transistors and more specifically to lateral field effect transistors including damage regions and field plates to reduce electric fields at the edges of the field plates and to enhance reverse breakdown voltages.

BACKGROUND OF THE INVENTION

The use of field effect transistors (FETs) in power circuits has become very popular. However, it is essential, especially in high power applications, that the ON resistance of the FETs be minimized while the reverse breakdown voltage is maximized. Generally, these two characteristics are inversely affected, which means that tradeoffs must be selected.

Conventionally, for power device related applications, silicon based power MOSFETs or IGBTs are used. However, Si MOSFETs have very high ON-resistance for high breakdown voltage ratings and IGBTs exhibit very poor switching characteristics. In another silicon device, referred to as double diffusion MOSFETs (DMOSFETs), gate-control occurs through an inversion channel that is formed in p-conductivity material along the lateral surface. However, due to the lack of manufacturable diffusion technology for silicon carbide, DMOSFET techniques cannot be used to fabricate SiC MOSFETs. Also, the inversion channel in the DMOSFETs is provided by forming gate oxide on p-conductivity material between the source and gate and for SiC this results in a poor quality of oxide with high fixed charges and a large number of traps at the oxide/SiC interface. This results in a reduction of the mobility of the carriers (electrons) that produce the current in the device and this reduction in the mobility of the electrons severely degrades the ON-resistance of the device.

An alternative, vertical structure for silicon carbide is a UMOSFET, an example of which is disclosed in U.S. Pat. No. 5,233,215, entitled "Silicon Carbide Power MOSFET with Floating Field Ring and Floating Field Plate" and issued Aug. 3, 1993. In the UMOSFETs an inversion channel is formed by an MOS gate along an etched trench. In the UMOSFETs, the gate oxide is again formed on a p-conductivity layer, which produces a poor quality oxide and high ON-resistance for SiC based FETs Accumulation mode FETs, an example of which is disclosed in U.S. Pat. No. 5,323,040, entitled "Silicon Carbide Field Effect Device" and issued Jun. 21, 1994, require the formation of an accumulation channel along the surface of an etched trench which results in poor quality gate oxide, causing high leakage current and large channel resistance. Another prior art device is a lateral MESFET formed in a silicon carbide material system. The major problems with this device is that for high voltage applications it has a large leakage current and poor gate control compared to a MOSFET.

Accordingly, it would be highly desirable to provide semiconductor transistors for power applications with a combined high reverse voltage breakdown and low leakage current.

It is a purpose of the present invention to provide a new and improved field effect transistor.

It is another purpose of the present invention to provide a new and improved field effect transistor with relatively low leakage current and high reverse breakdown voltage.

SUMMARY OF THE INVENTION

The above problems and others are at least partially solved and the above purposes and others are realized in a field effect transistor including a supporting substrate having an area with a first conductivity type and a channel layer positioned on the substrate and defining a surface. The channel layer has a second conductivity type and a first doping concentration. A laterally extending drift region is defined in the channel layer, the drift region having the second conductivity type and a second doping concentration higher than the first doping concentration.

A first current carrying terminal is positioned in electrical contact with the channel layer, the first current carrying terminal including a first contact region having the second conductivity type and a third doping concentration greater than the second doping concentration. The first contact region is defined in the channel layer adjacent the surface thereof and spaced from the drift region so as to define a channel region in the channel layer. The first current carrying terminal includes a first ohmic metal contact on the surface of the channel layer and in electrical contact with the first contact region.

A second current carrying terminal is positioned in electrical contact with the drift region and includes a second contact region having the second conductivity type and the third doping concentration. The second contact region is defined in the channel layer adjacent the surface thereof and adjacent the drift region and includes a second ohmic metal contact on the surface of the channel layer and in electrical contact with the second contact region.

The drift region, the first contact region, the channel region and the second contact region extend laterally (into and out of the paper), generally parallel with the surface of the channel layer and define a straight transistor portion and a curved transistor portion, as will be understood presently. A dielectric layer is positioned on the channel layer and includes a first portion with a first thickness overlying the channel region and a second portion with a second thickness greater than the first thickness overlying the drift region with the second portion extending laterally from the first portion to adjacent the second metal ohmic contact. A control terminal including a third metal contact is positioned on a surface of the first portion of the dielectric layer overlying the channel region.

The second ohmic metal contact has a first field plate electrically attached to the second metal contact and positioned on the second portion of the dielectric layer so as to define an edge extending toward the control terminal. The third metal contact has a second field plate electrically attached to the third metal contact and positioned on the second portion of the dielectric layer so as to define an edge extending toward the second current carrying terminal, the edge of the second field plate being spaced from the edge of the first field plate. A damaged region is defined in the drift region and underlies the edges of the first and second field plates in the curved transistor portion to reduce electric fields at the edges of the first and second field plates.

In a different embodiment, in addition to or instead of the damaged region underlying the edges of the first and second field plates only in the curved transistor portion, the edge of the first field plate extends toward the control terminal a first distance in the straight transistor portion and a second distance, greater than the first distance, in the curved transistor portion.

In a still different embodiment, in addition to or instead of the damaged region underlying the edges of the first and second field plates only in the curved transistor portion, the edge of the second field plate is spaced from the edge of the first field plate a first distance in the straight transistor portion and a second distance, greater than the first distance, in the curved transistor portion.

In another embodiment, in addition to or instead of the damaged region underlying the edges of the first and second field plates only in the curved transistor portion, the first contact region of the first current carrying terminal and the second contact region of the second current carrying terminal define a current channel therebetween, and the current channel has a first length in the straight transistor portion and a second length, greater than the first length, in the curved transistor portion.

Also, in a preferred embodiment, the supporting substrate and channel layer are formed from a silicon carbide material system with the first and second conductivity types, respectively, the subchannel layer and the channel layers being epitaxial layers. It will further be understood that the above described embodiments can all be included in a single device or otherwise included in any desired mix.

BRIEF DESCRIPTION OF THE DRAWINGS

Referring to the drawings.

DESCRIPTION OF THE PREFERRED EMBODIMENT

Figure 1:
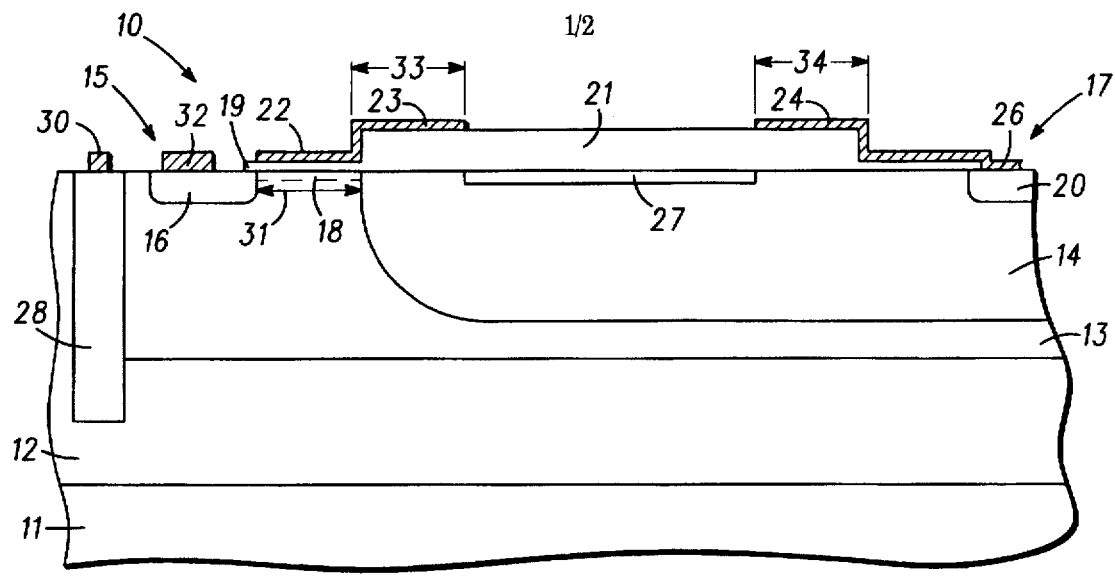
FIG. 1 is a simplified sectional view of a field effect transistor in accordance with the present invention, portions thereof broken away.

Turning now to FIG. 1, an enlarged cross-sectional portion of a field effect transistor 10 is illustrated, that has a high breakdown voltage and a low on-resistance in accordance with the present invention. In this specific embodiment, transistor 10 is fabricated in a silicon carbide (SiC) material system, but it will be understood that many of the novel features disclosed herein can be implemented in other material systems (e.g. silicon, gallium arsenide, gallium nitride, etc.) with similar advantages. In this embodiment a substrate includes a silicon carbide supporting substrate 11 with a sub-channel layer 12 epitaxially formed thereon. In the preferred embodiment, transistor 10 is an N-channel accumulation mode transistor with supporting substrate 11 being heavily doped P-type silicon carbide and sub-channel layer 12 having a lighter concentration P-type doping.

A channel layer 13 is epitaxially formed on sub-channel layer 12 and has a second or N-type doping in order to form a P-N junction at the interface of layers 12 and 13. Layers 12 and 13 are formed by epitaxial techniques that are well known to those skilled in the semiconductor art. The doping concentration and thickness of layers 12 and 13 are selected to control the threshold voltage of the device. The threshold voltage also depends on the thickness of the gate dielectric and on the gate metal work function. Further, this allows the design of the device such that it could be normally-on or normally-off as per the application requirements. In the preferred embodiment, layer 12 has a P-type doping concentration of approximately $2 \times 10^{15}$ to $2 \times 10^{16}$ atoms/cm$^3$ and a thickness of at least approximately five microns while layer 13 has an N-type doping concentration of approximately $0.8 \times 10^{16}$ to $2 \times 10^{16}$ atoms/cm$^3$ and a thickness of approximately 0.3 to 0.8 microns.

A laterally extending drift region 14 is formed adjacent the surface of channel layer 13 in order to provide transistor 10 an on-resistance less than approximately five milliohm-cm$^2$ and a breakdown voltage in the range of 600 to 1200 volts. Drift region 14 has an N-type doping concentration that is higher than the N-type doping concentration of channel layer 13. The thickness or depth of drift region 14 typically is at least half the thickness of layer 13 and can extend all the way into layer 12, if desired. In the preferred embodiment, drift region 14 has a doping concentration of approximately $1 \times 10^{17}$ to $5 \times 10^{17}$ atoms/cm$^3$ and a depth of approximately 0.3 to 0.8 microns in order to facilitate providing an on-resistance no greater than approximately five milliohm-cm$^2$. Additionally, the thickness and doping is chosen to facilitate the reduced surface field (RESURF) effect for a desired breakdown voltage.

A first current carrying terminal, which in this embodiment is a source terminal 15, includes a source contact region 16 formed adjacent the surface of channel layer 13 and spaced a first distance 31 from drift region 14. A source ohmic metal contact 32 on source contact region 16 facilitates electrical contact to contact region 16. A channel region 18 extends laterally from contact region 16 to drift region 14 adjacent the surface of channel layer 13. A second current carrying terminal, which in this embodiment is a drain terminal 17, includes a drain contact region 20 formed adjacent the surface of channel layer 13. A drain ohmic metal contact 26 on drain contact region 20 facilitates electrical contact to contact region 20. Drain contact region 20 is formed a sufficient distance from channel region 18 to provide a high breakdown voltage for transistor 10. Additionally, the width of channel region 18 (the distance from contact region 16 to drift region 14) is sufficient to support the desired breakdown voltage. In the preferred embodiment, drain contact region 20 is at least approximately six microns from channel region 18, and channel region 18 is approximately one to four microns wide to ensure that transistor 10 can be substantially turned-off.

A gate dielectric or insulating layer includes a thin portion 19 formed on the top surface of channel layer 13 and overlying channel region 18. Portion 19, in some embodiments, has one edge that substantially aligns with an edge of drift region 14 in order to ensure that channel region 18 is electrically connected to drift region 14 in an operative mode. A control or gate electrode 22, which includes a metal contact formed on the surface of portion 19 of the gate dielectric, has an edge that substantially aligns with the edge of drift region 14. In operation, at zero gate-to-source bias, channel region 18 is resistive and a small current flows from source contact region 16 to drain contact region 17, thus, a negative gate-to-source bias is generally required to prevent current flow. In some applications, the doping levels in sub-channel layer 12 and channel layer 13 and the gate material can be chosen so as to provide a device that would be normally-off at zero gate bias. When a positive gate-to-source bias or potential is applied, an accumulation region is formed in channel region 18. The accumulation region accumulates electrons in order to provide a low resistance path for electron flow between source contact region 16, channel region 18, drift region 14 and subsequently drain contact region 20. As mentioned above, doping levels and gate materials can be selected that prevent current flow at zero gate-to-source bias.

The gate dielectric or insulating layer also includes a thicker portion 21. In some embodiments, it is advantageous to position the components so that thicker portion 21 abuts thinner portion 19 and an edge of portion 19 substantially aligns with the edge of drift region 14. Thicker portion 21 also extends laterally across the surface of channel layer 13 toward drain contact region 17, and may overlap a portion of drain contact region 17, if desired. Portions 19 and 21 of the dielectric layer can be a variety of materials such as silicon dioxide, silicon nitride, or aluminum nitride including multilayer combinations thereof.

A gate terminal field plate 23 abuts gate electrode 22 and extends a second distance 33 onto portion 21 of the dielectric layer in order to reduce electric fields within transistor 10 and increase the breakdown voltage of transistor 10. Similarly, a drain field plate 24 has one end electrically connected to ohmic metal contact 26 of drain terminal 17, and extends a third distance 34 onto portion 21 of the dielectric layer in order to form an electrical field plate that gradually terminates electric potential lines and increases the breakdown voltage of transistor 10. The distance between plates 23 and 24 also affects the breakdown voltage of transistor 10, and is chosen to provide the desired breakdown voltage, as will be explained in more detail presently. In the preferred embodiment, distances 33 and 34 each are approximately five to ten microns, and the distance between plates 23 and 24 is approximately five to fifteen microns in order to achieve a breakdown voltage of at least approximately six hundred volts.

A damage termination or amorphized (damaged) region 27 facilitates increasing the gate-to-drain breakdown voltage of transistor 10. Damaged region 27 is an area where atoms are displaced from the lattice structure of drift region 14. The displaced atoms become interstitial atoms that are randomly distributed within drift region 14 and increase the resistance within region 27. For example, typical SiC material has about $1\times10^{13}$ missing or interstitial atoms/cm$^3$. Region 27 typically has greater than approximately $1\times10^{20}$ interstitial atoms/cm$^3$. Region 27 generally is created by implanting inert ions into drift region 14. The inert ions minimize electrical alteration of the material used for drift region 14. Region 27 improves depletion layer contouring and reduces electric fields therein, thus, improving the breakdown voltage of transistor 10.

An isolation plug 28 may, optionally, be included to isolate transistor 10 from other devices on substrate 11 and provide electrical connection to layer 12. Plug 28 is a P-type region that typically is formed by implantation techniques. A contact 30 provides electrical contact to plug 28, and is typically connected to electrode 32.

Figure 2:
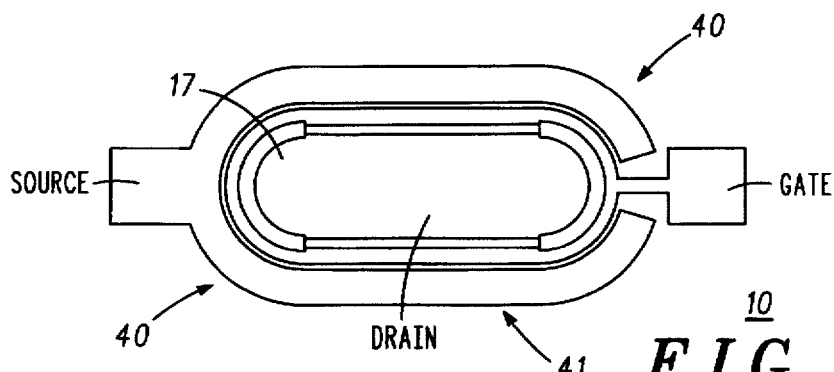
FIG. 2 is a top plan view of the field effect transistor of FIG. 1.
Figure 3:
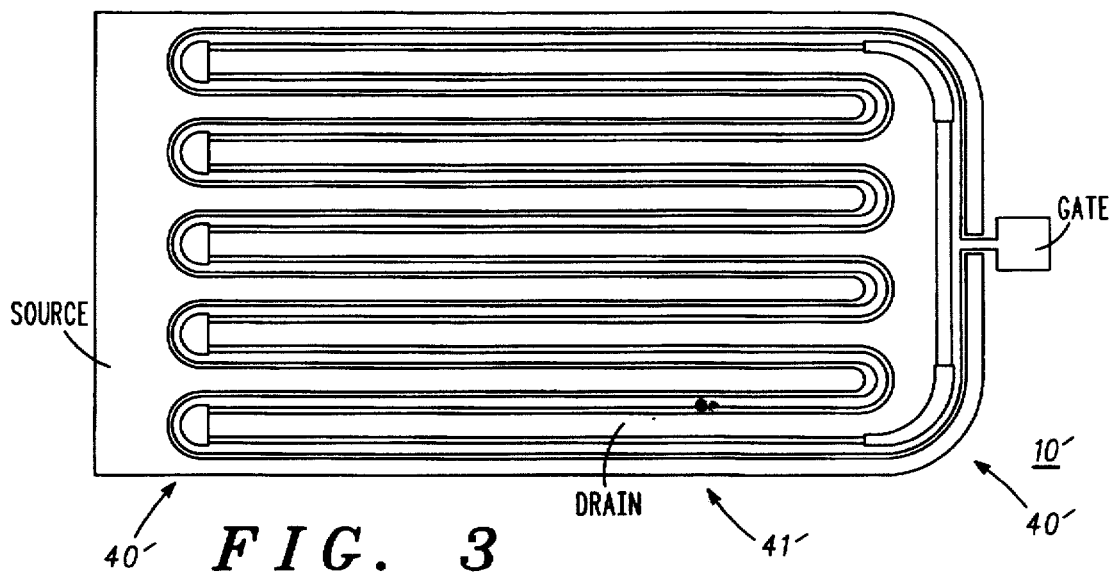
FIG. 3 is a top plan view similar to FIG. 2 of a large current field effect transistor.

It will be understood by those skilled in the art that in many instances, to realize a sufficient amount of current, transistor 10 of FIG. 1 is fabricated in a "racetrack" configuration, illustrated in top plan in FIG. 2, or in a serpentine configuration, illustrated in top plan in FIG. 3. For convenience in understanding, the transistor of FIG. 3 is designated 10' and components which are similar to components of transistor 10 of FIGS. 1 and 2 are indicated with similar numbers having a prime added to denote the different embodiment. In all such configurations it should be noted that there is at least one curved transistor portion 40 and at least one straight or linear transistor portion 41.

As explained above, damaged region 27 increases the resistance and, since it lies in the current path between source electrode 15 and drain electrode 17, it increases the channel resistance and, consequently, the ON resistance of transistor 10. In all prior art transistors a trade-off is necessary between the reverse breakdown voltage ($V_B$) and the ON resistance. In general, it is desirable to minimize the ON resistance for a designated $V_B$. For high-current, high-voltage lateral devices, the racetrack configuration illustrated in FIG. 2, with drain electrode 17 completely surrounded by gate electrode 22 and source electrode 15, is most often used. This configuration allows containment of the high voltage drain region inside the device and eliminates the need for any special edge termination outside the device.

For configurations including curved transistor portions 40 and straight transistor portions 41, electric field enhancement primarily occurs at drain terminal 17 and source terminal 15 of curved transistor portions 40 due to the rounded corners, which causes a high electric field because of potential crowding. In these transistor configurations, the device breakdown voltage is determined substantially by the $V_B$ designed for curved transistor portions 40. Thus, to have higher designed $V_B$ at curved transistor portions 40, damaged regions 27 are provided only in curved transistor portions 40 and straight transistor portions 41 are damage free. This allows drift region 14 in straight transistor portions 41 to be damage free, substantially reducing or minimizing the ON resistance. Similarly, in the serpentine configuration of FIG. 3, damaged regions 27' are provided only in curved transistor portions 40', which allows drift regions 14' in straight transistor portions 41' to be damage free, substantially reducing or minimizing the ON resistance. Further, since in a typical device the length of the gate along curved transistor portions 40 is expected to be much smaller as compared to the length of the gate along straight transistor portions 41, the increase in the ON-resistance due to the damaged regions in the curved transistor portions 40 is generally minimal.

Figure 4:
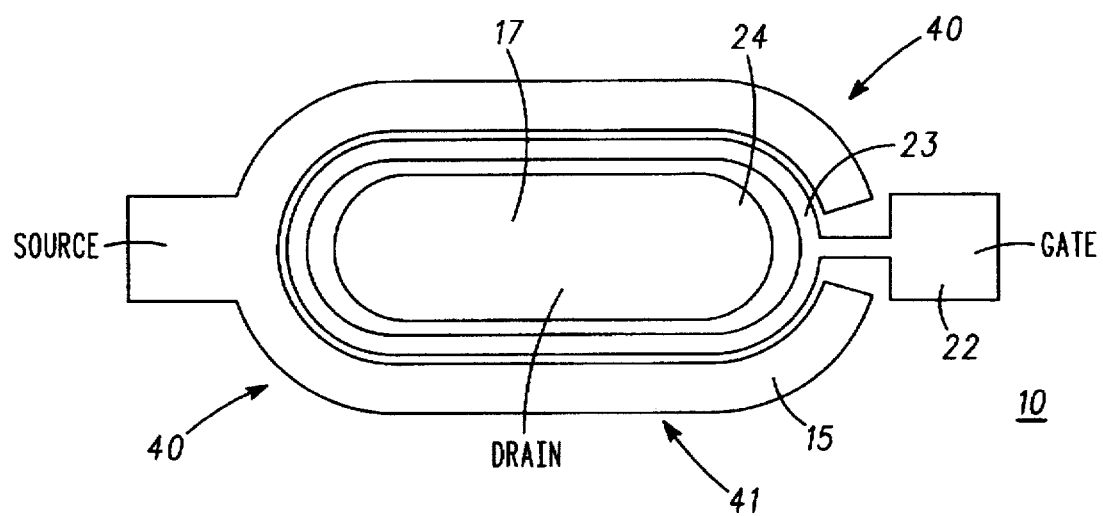
FIGS. 4 and 5 are top plan views of field effect transistors illustrating different features.

Turning now to FIG. 4, a different embodiment of the racetrack configuration of FIG. 2 is illustrated in top plan. For convenience of understanding, components of FIG. 4 which are similar to those described in conjunction with FIGS. 1 and 2 are designated with similar numbers. Again, it should be noted that the device breakdown voltage is determined primarily by the $V_B$ designed for curved transistor portions 40 because of the potential crowding at the rounded corners. In this embodiment, the spacing between the edges of gate field plate 23 and drain field plate 24 is greater in curved transistor portions 40 than in straight transistor portions 41. This change in the edge spacing provides a linear increase in $V_B$. As an example, the spacing in straight transistor portions 41 has a length of 1× and the spacing in curved transistor portions 40 has a length of 2×. It should of course be noted that the spacing makes a smooth transition from the straight to the curved transistor portion just as the components (i.e. the field plates) make a smooth transition. This change in spacing allows increased $V_B$ at the rounded portions of transistor 10 without increasing the ON resistance of straight transistor portions 41.

Figure 5:
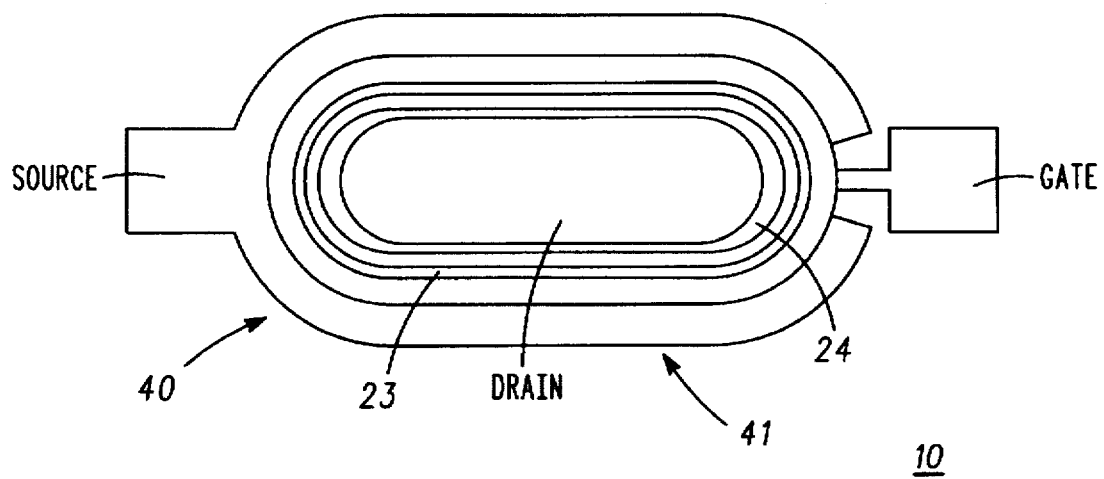

Turning now to FIG. 5, another embodiment of the racetrack configuration of FIG. 2 is illustrated in top plan. For convenience of understanding, components of FIG. 5 which are similar to those described in conjunction with FIGS. 1 and 2 are designated with similar numbers. Again, it should be noted that the device breakdown voltage is determined primarily by the $V_B$ designed for curved transistor portions 40 because of the potential crowding at the rounded corners. Gate and drain field plates 23 and 24 are formed over reasonably thick dielectric portion 21, which improves $V_B$ of transistor 10. However, this may lead to a corresponding increase in the ON resistance of transistor 10 as well.

Thus, to optimize the $V_B$ and the On resistance, in this embodiment, drain field plate 24 is increased in width (distance 34 in FIG. 1) in curved transistor portions 40. As an example, drain field plate 24 in straight transistor portions 41 has a length of 1× and drain field plate 24 in curved transistor portions 40 has a length of 1.5× to 2×. It will of course be understood that the drain field plate is extended in this embodiment for convenience but in some applications it may be more convenient to extend the gate field plate 23, or both the drain and gate field plates.

While several different changes to a field effect transistor have been disclosed, each of which individually improves the $V_B$ and the ON resistance of the transistor, it should be understood that the above described embodiments can all be included in a single device or otherwise included in any desired mix. In some applications it may even be desirable to increase the channel length in the curved transistor portions over the length in the straight transistor portions. Also, in a preferred embodiment, the supporting substrate and channel layer are formed from a silicon carbide material system with the first and second conductivity types, respectively, the subchannel layer and the channel layers being epitaxial layers.

Thus, a new and improved field effect transistor is disclosed with relatively low leakage current and high reverse breakdown voltage. The low On resistance of the device is provided by employing damaged regions and modified field plates only in curved transistor portions where the electric field enhancement is high due to the rounded corners. Also, the high $V_B$ is provided by utilizing damaged regions and modified field plates at the rounded corners where the electric field enhancement is highest.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A field effect transistor comprising:

a substrate including an area with a first conductivity type;

a channel layer positioned on the substrate and defining a surface, the channel layer having a second conductivity type and a first doping concentration;

a laterally extending drift region defined in the channel layer, the drift region having the second conductivity type and a second doping concentration higher than the first doping concentration;

a first current carrying terminal positioned in electrical contact with the channel layer, the first current carrying terminal including a first contact region having the second conductivity type and a third doping concentration greater than the second doping concentration, the first contact region being defined in the channel layer adjacent the surface thereof and spaced from the drift region so as to define a channel region in the channel layer, the first current carrying terminal further including a first ohmic metal contact on the surface of the channel layer and in electrical contact with the first contact region;

a second current carrying terminal positioned in electrical contact with the drift region, the second current carrying terminal including a second contact region having the second conductivity type and the third doping concentration, the second contact region being defined in the channel layer adjacent the surface thereof and adjacent the drift region, the second current carrying terminal further including a second ohmic metal contact on the surface of the channel layer and in electrical contact with the second contact region;

the drift region, the first contact region, the channel region and the second contact region extending laterally, generally parallel with the surface of the channel layer and defining a straight transistor portion and a curved transistor portion;

a dielectric layer positioned on the channel layer and including a first portion with a first thickness overlying the channel region and a second portion with a second thickness greater than the first thickness overlying the drift region, the second portion extending laterally from the first portion to adjacent the second metal ohmic contact;

a control terminal including a third metal contact positioned on a surface of the first portion of the dielectric layer overlying the channel region;

the second ohmic metal contact having a first field plate electrically attached to the second metal contact and positioned on the second portion of the dielectric layer so as to define an edge extending toward the control terminal; and a damaged region defined in the drift region and underlying the edges of the first field plate and the third metal contact only in the curved transistor portion to reduce electric fields at the edges of the first field plate and the third metal contact.

2. A field effect transistor as claimed in claim 1 wherein the substrate and channel layer are formed from a silicon carbide material system.

3. A field effect transistor as claimed in claim 1 wherein the substrate includes a subchannel layer defining the area with the first conductivity type, the subchannel layer and the channel layers being epitaxial layers.

4. A field effect transistor as claimed in claim 1 wherein the edge of the first field plate extends toward the control terminal a first distance in the straight transistor portion and a second distance, greater than the first distance, in the curved transistor portion.

5. A field effect transistor as claimed in claim 1 wherein the third metal contact includes a second field plate electrically attached to the third metal contact and positioned on the second portion of the dielectric layer so as to define an edge extending toward the second current carrying terminal, the edge of the second field plate being spaced from the edge of the first field plate.

6. A field effect transistor as claimed in claim 5 wherein the edge of the second field plate is spaced from the edge of the first field plate a first distance in the straight transistor portion and a second distance, greater than the first distance, in the curved transistor portion.

7. A field effect transistor as claimed in claim 1 wherein the first contact region of the first current carrying terminal and the second contact region of the second current carrying terminal define a current channel therebetween, and the current channel has a first length in the straight transistor portion and a second length, greater than the first length, in the curved transistor portion.

8. A field effect transistor comprising:

a substrate formed from a silicon carbide material system and including a first conductivity type area;

a channel layer positioned on the first conductivity type area of the substrate and defining a surface, the channel layer having a second conductivity type and a first doping concentration;

a laterally extending drift region defined in the channel layer, the drift region having the second conductivity type and a second doping concentration higher than the first doping concentration;

a source terminal positioned in electrical contact with the channel layer, the source terminal including a source contact region having the second conductivity type and a third doping concentration greater than the second doping concentration, the source contact region being defined in the channel layer adjacent the surface thereof and spaced from the drift region so as to define a channel region in the channel layer, the source terminal further including a source contact on the surface of the channel layer and in electrical contact with the source contact region;

a drain terminal positioned in electrical contact with the drift region, the drain terminal including a drain contact region having the second conductivity type and the third doping concentration, the drain contact region being defined in the channel layer adjacent the surface thereof and adjacent the drift region, the drain terminal further including a drain contact on the surface of the channel layer and in electrical contact with the drain contact region, the source contact region and the drain contact region defining a current channel therebetween including the channel region and a portion of the drift region;

the current channel extending laterally, generally parallel with the surface of the channel layer and defining a straight transistor portion and a curved transistor portion, and the current channel having a first length in the straight transistor portion and a second length, greater than the first length, in the curved transistor portion;

an oxide layer positioned on the channel layer and including a first portion with a first thickness overlying the channel region and a second portion with a second thickness greater than the first thickness overlying the drift region, the second portion extending laterally from the first portion to adjacent the drain contact;

a gate terminal including a gate contact positioned on a surface of the first portion of the oxide layer overlying a portion of the channel region in the current channel;

the drain contact having a first field plate electrically attached to the drain contact and positioned on the second portion of the oxide layer so as to define an edge extending toward the gate terminal; and a damaged region defined in the drift region and underlying the edges of the first field plate and the gate contact in the curved transistor portion to reduce electric fields at the edges of the first field plate and the gate contact.

9. A field effect transistor as claimed in claim 8 wherein the edge of the first field plate extends toward the gate terminal a first distance in the straight transistor portion and a second distance, greater than the first distance, in the curved transistor portion.

10. A field effect transistor as claimed in claim 8 wherein the gate contact has a second field plate electrically attached to the gate contact and positioned on the second portion of the oxide layer so as to define an edge extending toward the drain terminal.

11. A field effect transistor as claimed in claim 10 wherein the edge of the second field plate is spaced from the edge of the first field plate a first distance in the straight transistor portion and the edge of the second field plate is spaced from the edge of the first field plate a second distance, greater than the first distance, in the curved transistor portion.

12. A field effect transistor comprising:

a substrate formed from a silicon carbide material system and including a first conductivity type area;

a channel layer positioned on the first conductivity type area of the substrate and defining a surface, the channel layer having a second conductivity type and a first doping concentration;

a laterally extending drift region defined in the channel layer, the drift region having the second conductivity type and a second doping concentration higher than the first doping concentration;

a source terminal positioned in electrical contact with the channel layer, the source terminal including a source contact region having the second conductivity type and a third doping concentration greater than the second doping concentration, the source contact region being defined in the channel layer adjacent the surface thereof and spaced from the drift region so as to define a channel region in the channel layer, the source terminal further including a source contact on the surface of the channel layer and in electrical contact with the source contact region;

a drain terminal positioned in electrical contact with the drift region, the drain terminal including a drain contact region having the second conductivity type and the third doping concentration, the drain contact region being defined in the channel layer adjacent the surface thereof and adjacent the drift region, the drain terminal further including a drain contact on the surface of the channel layer and in electrical contact with the drain contact region, the source contact region and the drain contact region defining a current channel therebetween including the channel region and a portion of the drift region;

the current channel extending laterally, generally parallel with the surface of the channel layer and defining a straight transistor portion and a curved transistor portion, and the current channel having a first length in the straight transistor portion and a second length, greater than the first length, in the curved transistor portion;

an oxide layer positioned on the channel layer and including a first portion with a first thickness overlying the channel region and a second portion with a second thickness greater than the first thickness overlying the drift region, the second portion extending laterally from the first portion to adjacent the drain contact;

a gate terminal including a gate contact positioned on a surface of the first portion of the oxide layer overlying a portion of the channel region in the current channel;

the drain contact having a first field plate electrically attached to the drain contact and positioned on the second portion of the oxide layer so as to define an edge extending toward the gate terminal;

the gate contact having a second field plate electrically attached to the gate contact and positioned on the second portion of the oxide layer so as to define an edge extending toward the drain terminal, and the edge of the second field plate being spaced from the edge of the first field plate a first distance in the straight transistor portion and a second distance, greater than the first distance, in the curved transistor portion; and a damaged region defined in the drift region and underlying the edges of the first and second field plates.

13. A field effect transistor comprising:

a substrate formed from a silicon carbide material system and including a first conductivity type area;

a channel layer positioned on the first conductivity type area of the substrate and defining a surface, the channel layer having a second conductivity type and a first doping concentration;

a laterally extending drift region defined in the channel layer, the drift region having the second conductivity type and a second doping concentration higher than the first doping concentration;

a source terminal positioned in electrical contact with the channel layer, the source terminal including a source contact region having the second conductivity type and a third doping concentration greater than the second doping concentration, the source contact region being defined in the channel layer adjacent the surface thereof and spaced from the drift region so as to define a channel region in the channel layer, the source terminal further including a source contact on the surface of the channel layer and in electrical contact with the source contact region;

a drain terminal positioned in electrical contact with the drift region, the drain terminal including a drain contact region having the second conductivity type and the third doping concentration, the drain contact region being defined in the channel layer adjacent the surface thereof and adjacent the drift region, the drain terminal further including a drain contact on the surface of the channel layer and in electrical contact with the drain contact region, the source contact region and the drain contact region defining a current channel therebetween including the channel region and a portion of the drift region;

the current channel extending laterally, generally parallel with the surface of the channel layer and defining a straight transistor portion and a curved transistor portion, and the current channel having a first length in the straight transistor portion and a second length, greater than the first length, in the curved transistor portion;

an oxide layer positioned on the channel layer and including a first portion with a first thickness overlying the channel region and a second portion with a second thickness greater than the first thickness overlying the drift region, the second portion extending laterally from the first portion to adjacent the drain contact;

a gate terminal including a gate contact positioned on a surface of the first portion of the oxide layer overlying a portion of the channel region in the current channel;

the drain contact having a first field plate electrically attached to the drain contact and positioned on the second portion of the oxide layer so as to define an edge extending toward the gate terminal;

the gate contact having a second field plate electrically attached to the gate contact and positioned on the second portion of the oxide layer so as to define an edge extending toward the drain terminal, and the edge of the second field plate being spaced from the edge of the first field plate a first distance in the straight transistor portion and a second distance, greater than the first distance, in the curved transistor portion; and a damaged region defined in the drift region and underlying the edges of the first and second field plates only in the curved transistor portion to reduce electric fields at the edges of the first field plate and the third metal contact.

* * * * *